(12) United States Patent
Edlinger

(10) Patent No.: US 10,843,284 B2
(45) Date of Patent: Nov. 24, 2020

(54) METHOD FOR VOID REDUCTION IN SOLDER JOINTS

(71) Applicant: ZKW Group GmbH, Wieselburg (AT)

(72) Inventor: Erik Edlinger, Vienna (AT)

(73) Assignee: ZKW Group GmbH, Wieselburg (AT)

( * ) Notice: Subject to any disclaimer, the term of this patent is extended or adjusted under 35 U.S.C. 154(b) by 296 days.

(21) Appl. No.: 15/536,377

(22) PCT Filed: Nov. 18, 2015

(86) PCT No.: PCT/AT2015/050295
§ 371 (c)(1),
(2) Date: Jun. 15, 2017

(87) PCT Pub. No.: WO2016/094915
PCT Pub. Date: Jun. 23, 2016

(65) Prior Publication Data
US 2018/0093338 A1 Apr. 5, 2018

(30) Foreign Application Priority Data
Dec. 18, 2014 (AT) .............................. A 50924/2014

(51) Int. Cl.
*H05K 3/34* (2006.01)
*B23K 1/00* (2006.01)
(Continued)

(52) U.S. Cl.
CPC ............ *B23K 1/0016* (2013.01); *B23K 1/008* (2013.01); *B23K 1/203* (2013.01); *H05K 3/3452* (2013.01);
(Continued)

(58) Field of Classification Search
CPC ...... B23K 1/0016; B23K 1/008; B23K 1/203; B23K 2101/42; H05K 1/111;
(Continued)

(56) References Cited

U.S. PATENT DOCUMENTS 5,172,852 A * 12/1992 Bernardoni ............ H05K 1/111
228/180.21
5,180,097 A * 1/1993 Zenshi ................... H05K 1/111
228/180.21
(Continued)

FOREIGN PATENT DOCUMENTS

EP 0964607 A1 12/1999
EP 2455966 A1 5/2012
(Continued)

OTHER PUBLICATIONS

Office Action issued in AT application No. A 50924/2014, dated Nov. 10, 2015.
(Continued)

*Primary Examiner* — Erin B Saad
*Assistant Examiner* — Carlos J Gamino
(74) *Attorney, Agent, or Firm* — Eversheds Sutherland (US) LLP

(57) ABSTRACT

The invention relates to a process to connect, by soldering, at least one electronic component (104, 204, 304, 404, 504) with a mounting plate (100, 200, 300, 400, 500), the mounting plate having at least one mounting plate contact surface (102, 202, 302, 402, 502) and the at least one electronic component having at least one component contact surface (105) corresponding to it, the at least one mounting plate contact surface being surrounded by a solder resist layer (101, 201, 301, 401, 501) that borders the at least one mounting plate contact surface, the process having the following steps: a) Applying solder paste (106, 206, 306, 406, 506) onto at least areas of the solder resist layer (101, 201, 301, 401, 501), minimally overlapping with the mounting plate contact surface (102, 202, 302, 402, 502) adjacent to the solder resist layer, b) Equipping the mounting plate with the at least one electronic component (104, 204, 304, 404, 504), the at least one component contact surface (105)

(Continued)

at least partly covering the at least one mounting plate contact surface (102, 202, 302, 402, 502) corresponding to it; and c) Heating the solder paste (106, 206, 306, 406, 506) to produce a soldered connection between the mounting plate and the at least one component.

20 Claims, 5 Drawing Sheets

(51) Int. Cl.
  *B23K 1/008* (2006.01)
  *B23K 1/20* (2006.01)
  *B23K 101/42* (2006.01)
  *H05K 1/11* (2006.01)
  *H05K 3/30* (2006.01)

(52) U.S. Cl.
  CPC ........ *H05K 3/3485* (2020.08); *B23K 2101/42* (2018.08); *H05K 1/111* (2013.01); *H05K 3/305* (2013.01); *H05K 3/3431* (2013.01); *H05K 3/3494* (2013.01); *H05K 2201/099* (2013.01); *H05K 2203/042* (2013.01); *H05K 2203/1178* (2013.01)

(58) Field of Classification Search
  CPC ....... H05K 2201/099; H05K 2203/042; H05K 2203/1178; H05K 3/305; H05K 3/3431; H05K 3/3452; H05K 3/3484; H05K 3/3494
  USPC ........................................................ 228/258
  See application file for complete search history.

(56) References Cited

U.S. PATENT DOCUMENTS

| | | | | |
|---|---|---|---|---|
| 5,282,565 A * | 2/1994 | Melton | ................... | H01L 24/16 228/180.22 |
| 5,400,953 A * | 3/1995 | Maeno | ................... | H05K 3/321 228/248.1 |
| 5,707,714 A | 1/1998 | Furutatsu et al. | | |
| 5,738,269 A * | 4/1998 | Masterton | ......... | H01L 23/49816 228/248.1 |
| 5,806,588 A * | 9/1998 | Weeks, Jr. | ........... | B23K 35/001 165/181 |
| 6,296,174 B1 * | 10/2001 | Chiang | ................ | B23K 1/0016 228/214 |
| 6,316,736 B1 * | 11/2001 | Jairazbhoy | ............. | H05K 1/111 174/250 |
| 6,521,997 B1 * | 2/2003 | Huang | ................ | H01L 23/3121 174/255 |
| 6,734,570 B1 * | 5/2004 | Archer | ............. | H01L 23/49838 257/786 |
| 7,872,874 B2 * | 1/2011 | Karasawa | .............. | H05K 1/111 361/767 |
| 7,886,957 B2 * | 2/2011 | Kim | ................... | G01R 1/06727 228/180.22 |
| 8,072,769 B2 * | 12/2011 | Ieki | ........................ | H05K 1/183 361/761 |
| 9,403,240 B2 * | 8/2016 | Revel | .................... | C04B 37/005 |
| 9,573,852 B2 * | 2/2017 | Revel | .................... | C04B 37/005 |
| 2001/0005241 A1 * | 6/2001 | Yamate | ................ | G02F 1/13452 349/58 |
| 2003/0056975 A1 | 3/2003 | Kochanowski et al. | | |
| 2003/0184986 A1 * | 10/2003 | Soga | .................. | H05K 3/3442 361/767 |
| 2005/0224560 A1 | 10/2005 | Takesue | | |
| 2007/0035021 A1 * | 2/2007 | Suzuki | .................... | H01L 24/32 257/737 |
| 2008/0190552 A1 * | 8/2008 | Bouillon | .................. | B23K 1/08 156/256 |
| 2009/0001138 A1 | 1/2009 | Tameerug | | |
| 2012/0103678 A1 * | 5/2012 | Inaba | ..................... | H05K 3/244 174/263 |
| 2012/0325538 A1 * | 12/2012 | Chiang | ................ | H05K 3/3484 174/260 |

FOREIGN PATENT DOCUMENTS

| | | |
|---|---|---|
| JP | S63-273398 A | 11/1988 |
| JP | 2003-264255 A | 9/2003 |
| JP | 2012059814 A | 3/2012 |
| WO | 2007/060657 A1 | 5/2007 |

OTHER PUBLICATIONS

International Preliminary Report on Patentability for PCT/AT2015/050295, dated Mar. 8, 2017.

* cited by examiner

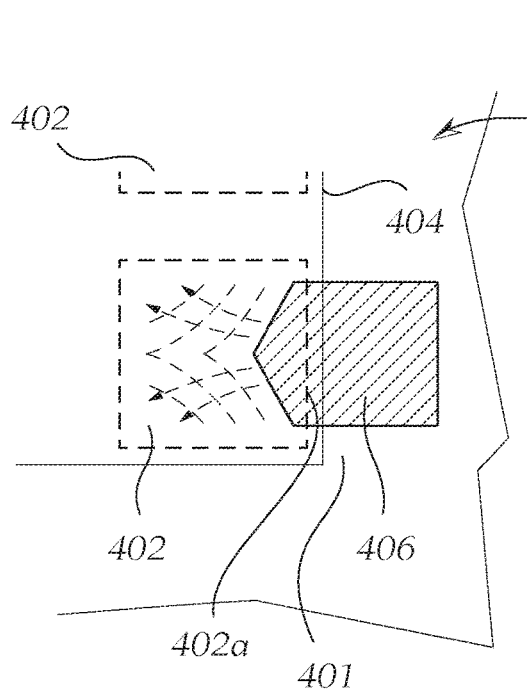
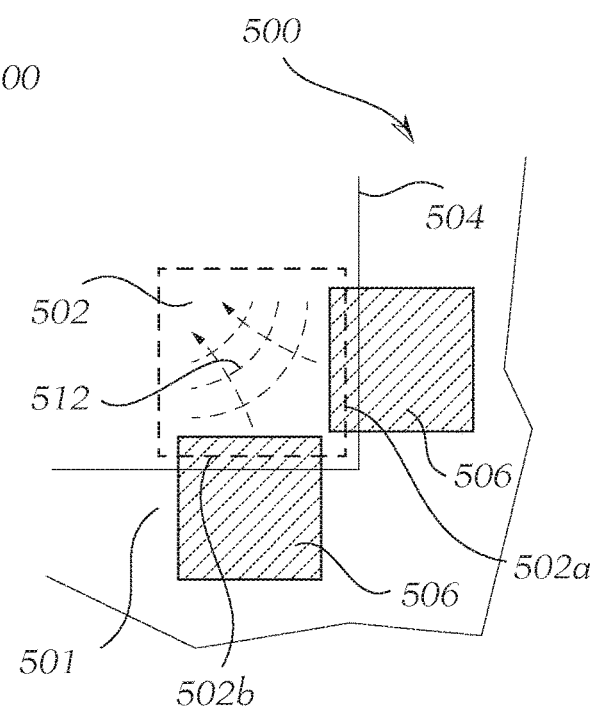
Fig. 6
Fig. 7
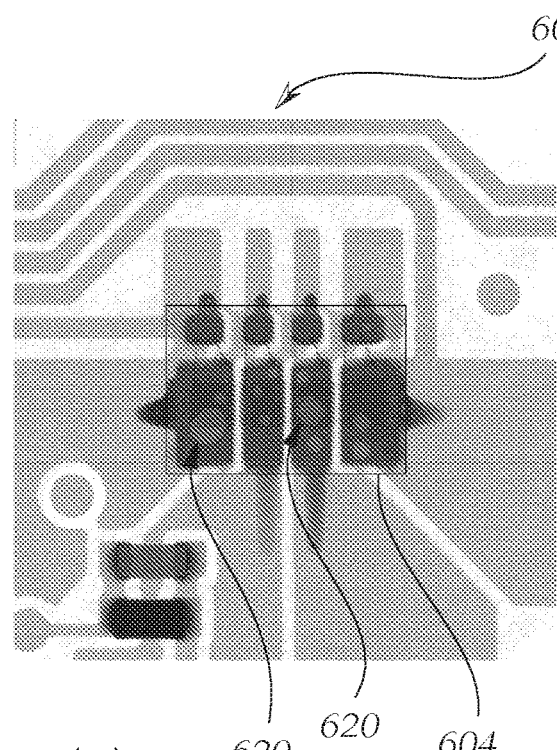
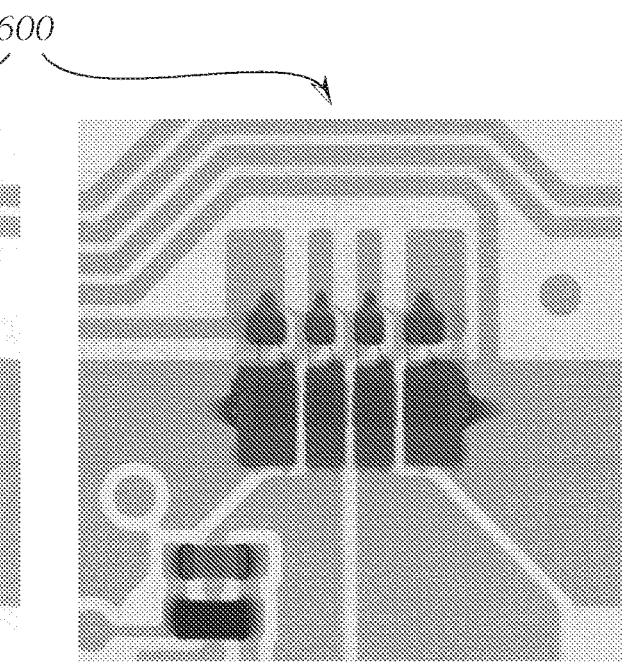
Fig. 8

METHOD FOR VOID REDUCTION IN SOLDER JOINTS

The invention relates to a process to connect, by soldering, at least one electronic component with a mounting plate, the mounting plate having at least one mounting plate contact surface and the at least one electronic component having at least one component contact surface corresponding to it, the at least one mounting plate contact surface being surrounded by a solder resist layer that borders the at least one mounting plate contact surface.

Attaching electronic components to mounting plates, for example to printed circuit boards or circuit boards, is a process that is very frequently required in the production of electrical circuits. Printed circuit boards generally have conductor tracks, which connect individual or multiple connection contacts with one another, individual electronic components being connected with the electrical connection contacts. The connection can have multiple aspects such as, for example, the connection can be electrical, mechanical, and/or thermal.

The prior art discloses different methods which can be used to connect an electronic component with a mounting plate. Thus, for example, contact surfaces of individual electronic components, also referred to below as component contact surfaces, can be soldered with contact surfaces arranged on the mounting plates (also referred to below as mounting plate contact surfaces).

Here the MST (Surface Mount Technology) process should be mentioned, which involves the electrical connections or contact surfaces of the electronic component and the corresponding contact surfaces of the mounting plate each being located on their surfaces, and the electronic components only needing to be fastened to the surface of the mounting plate, it being unnecessary to provide through holes. This involves first coating the contact surfaces of the mounting plate with a solder, for the most part a solder paste. After that, the mounting plate is equipped with individual electronic components.

To produce a permanent electrical and/or thermal and/or mechanical connection of the electronic components with the mounting plate, the reflow soldering process is known, for example, which involves heating the solder paste and the contact surfaces after the mounting plate is equipped with the electronic components, so that the solder paste melts and connects with the contact surfaces of the mounting plate and of the respective electronic component.

In the classic SMT process, a solder paste contains both a solder material (which permanently connects the contact surfaces that are involved) and also fluxes, which improve the solderability (especially the flow behavior and wetting behavior) of the solder material by removing oxides on the surfaces of the contact surfaces. When the solder paste is heated and melted, excess flux embedded in the solder paste becomes gaseous and escapes in the form of small bubbles. For the most part, a screen printing process or mask printing process is used to apply the solder paste to the mounting plate in the form of solder deposits before electronic components are placed on it. The shapes of these solder deposits generally follow the shapes of corresponding mounting plate contact surfaces, so that the paste is only applied to the mounting plate contact surfaces.

A problem that frequently occurs in SMT technology is the formation of hollow spaces in the solder joints, which are referred to as shrinkage cavities or voids. A possible cause of the development of voids is that the flux embedded in the solder paste cannot completely escape from the solder during soldering, and therefore accumulates within the solder joint. These voids not only have a negative influence on the life and the thermal conductivity of the solder joint; in the worst case they can also lead to the total failure of the electronic component and therefore are frequently used as an exclusion criterion or quality characteristic which leads to very high additional costs in the production of circuit boards or leads to a large number of circuit board rejects. Here the percentage surface area of the voids is the criterion of choice for selecting the rejected parts. In the case of especially large components, the number of voids is higher, since larger areas of the surface of the printed solder are covered by the component, and therefore the outgassing flux must travel farther before it can escape to the outside through the free side surfaces; consequently the number of rejects here is also somewhat higher. If the formation of voids can be prevented or kept to a minimum, the number of rejects could therefore be clearly reduced.

U.S. Pat. No. 8,678,271 B2 discloses a process to prevent void formation by equipping the contact surfaces with a preformed solder paste layer (known as a solder preform). Before the preformed solder paste layer is applied, it is structured to produce outgassing channels to remove outgassing flux.

US 2009/0242023 A1 discloses a soldering process that involves printing the solder paste in various structures to produce outgassing channels to remove outgassing flux.

JPS63273398 A describes a process that involves printing solder paste next to the areas of the circuit board contact surface, where the component contact surfaces are positioned. To accomplish this, the circuit board contact surface next to the component is pulled out and thus the solder paste is applied exclusively to the circuit board contact surface next to the component with which it is being equipped before soldering. During soldering, part of the molten solder paste is pulled under the component, but there is not necessarily capillary action. This process is specifically for components that are contacted through the side surfaces of the electrodes.

Therefore, it is a goal of the invention to provide a soldering process which can prevent or minimize the formation of voids in solder joints, and in this way reduce the number of circuit board rejects and increase the life of the soldered components.

This is accomplished by a process to connect, by soldering at least one electronic component with a mounting plate of the type mentioned at the beginning, which is characterized by the following steps:

a) Applying solder paste onto at least areas of the solder resist layer, minimally overlapping with the mounting plate contact surface (here also referred to as a pad) adjacent to the solder resist layer;

b) Equipping the mounting plate with the at least one electronic component, the at least one component contact surface at least partly covering the at least one mounting plate contact surface corresponding to it; and c) Heating the solder paste to produce a soldered connection between the mounting plate and the at least one component.

The invention, which provides a targeted atypical distribution of the solder paste outside the pads on the solder resist layer, only minimally overlapping with the pad, can prevent voids in solder joints, or reduce them to a minimum. The invention makes use of the flow characteristics of the solder paste, and additionally takes advantage of capillary action.

Deliberate avoidance of solder paste directly under the pad allows early outgassing of excess flux, and thus makes it possible for bubble formation to be almost completely avoided. Thus, it was possible to establish in experiments (see example 1 further below), that the inventive soldering process can significantly reduce the formation of voids. This not only minimizes the number of rejects and increases the life of the electronic components; the inventive process can also reduce by about 40% the amount of solder paste required. The invention is applicable to solder joints with pads of any shape and to components of any type.

Solder pastes that can be mentioned as especially suitable for the invention are SAC (SnAgCu) solders, e.g., SAC 305 (supplied by, e.g., the Kester Company) and commonly used flux-containing solders that can be applied by doctor blade.

All commonly used solder resists known to a person skilled in the art, e.g. epoxy resins, are suitable for the invention.

The contact surfaces of the mounting plate and the components are advantageously coated with tin, silver, and/or gold. A tin, silver, or gold layer protects the contact surfaces from corrosion, and can be applied to other electrically conductive layers (e.g., copper) arranged beneath the protective layer.

In practice, the mounting plate contact surfaces (pads on the mounting plate side) or the corresponding component contact surfaces (pads on the component side) are, for the most part, quadrilateral, especially rectangular, with two long sides and two transverse sides each. However, pads are also known which have more than four sides (polygons) or which have another shape, such as, e.g., a circular or oval shape.

The phrase "minimally overlapping with the mounting plate contact surface adjacent to the solder resist layer" as used here means that the solder paste overlaps with the mounting plate contact surface and, after the component is mounted, with the component contact surface only far enough that capillary action that pulls the molten solder into the area between the component contact surface and the mounting plate contact surface has an effect. The depth of this overlap is usually determined by the tolerances of the printing of the solder paste. For the most part, the solder paste is applied in the form of solder deposits, in a way known in the art, using a screen or mask printing process, before electronic components are placed on it. Preferably, the depth of the minimum overlap of the solder paste with the mounting plate contact surface lies in the range of 0.2-0.5 mm. More preferably, the depth of the minimum overlap is about 0.3 mm; this usually corresponds to twice the tolerance of the printing process.

Preferably, the mounting plate contact surface is essentially quadrilateral, and the solder paste is applied to the solder resist layer along a long side and/or a transverse side of the mounting plate contact surface, minimally overlapping with the mounting plate contact surface. Depending on the mounting plate contact surface (pad) layout or design that is used, the solder paste is applied to the adjacent solder resist layer along a long side, along a transverse side, or along a long side and a transverse side (here also referred to as a narrow side or wide side) of the pad, minimally overlapping with the pad. If the mounting plate contact surfaces are rectangular, the long side is, accordingly, longer than the transverse side. If the mounting plate contact surface is square, its long side and its transverse side are, accordingly, of the same length.

In the case of a subvariant, the solder paste is therefore applied to the solder resist layer along one long side of the mounting plate contact surface, minimally overlapping with the mounting plate contact surface.

In the case of another subvariant, the solder paste is consequently applied to the solder resist layer along a transverse side of the mounting plate contact surface, minimally overlapping with the mounting plate contact surface.

If the solder paste is provided next to only one side edge of the contact surface, minimally overlapping with this side edge, then the solder front typically spreads out parallel to this edge. To affect the direction of spread of the solder front and to facilitate or allow displacement of the atmosphere under the component, it has turned out to be advantageous to apply the solder paste to the solder resist layer along a long side and a transverse side of the mounting plate contact surface, minimally overlapping with the mounting plate contact surface. In this variant, in which the solder paste simultaneously overlaps on a long side and a transverse side, the solder front runs essentially diagonally and obviously defines a certain direction for the atmosphere to escape, without being bound to a certain theory. Experiments have shown this variant to be especially advantageous in the case of large pads, for which the air effectively under the component must be displaced, e.g., for light-emitting diodes (LED) with large mounting plate contact surfaces, e.g., the OSLON Black Flat LED with two emitting surfaces.

Alternatively to the previously mentioned embodiment, in another embodiment the overlap of the solder paste with the contact surface can vary along a side edge (long side or transverse side), i.e., the overlap increases from a minimum value as defined below ("minimum overlap") in areas along the side edge. Accordingly, the solder paste is applied to the solder resist layer along a long side or a transverse side of the mounting plate contact surface, the depth of the overlap of the solder paste with the mounting plate contact surface increasing in areas along the long side or the transverse side starting from a minimum overlap. In a subvariant, the largest (maximum) overlap is reached essentially in the middle of the side edge. In another variant, the largest overlap is reached at one end of the side edge. In special further developments, the largest overlap can extend all the way to the opposite side edge of the mounting plate pad. It is useful to provide areas of greater overlap to facilitate displacement of the atmosphere and the continuing flow of solder in areas where displacement is difficult. Therefore, this variant has also been shown to be especially advantageous in the case of large pads, for which the air effectively under the component must be displaced, e.g., for light-emitting diodes (LED) with large mounting plate contact surfaces, e.g., the OSLON Black Flat LED with two emitting surfaces.

The depth of the minimum overlap of the solder paste with an essentially rectangular mounting plate contact surface along a long side of the mounting plate contact surface advantageously lies in a range of 0.2-0.5 mm. More preferably, the depth of the minimum overlap is about 0.3 mm; this usually corresponds to twice the tolerance of the printing process.

With regard to the application of solder paste along a transverse side of an essentially rectangular mounting plate contact surface, it is advantageous if the depth of the minimum overlap of the solder paste with the mounting plate contact surface along a transverse side of the mounting plate contact surface lies in a range of 0.3-0.7 mm. More preferably, the depth of the minimum overlap is about 0.5 mm.

If the mounting plate contact surface is essentially square, i.e., the long side and the transverse side are essentially of the same length, then the depth of the minimum overlap of the solder paste along a side edge of the square mounting plate contact surface lies in a range of 0.2-0.5 mm, more preferably about 0.3 mm.

After the mounting plate is correctly equipped with the component, the depth of the overlap of the solder paste with the component contact surface essentially corresponds to the above-mentioned depth of the overlap of the solder paste with the mounting plate contact surface. This makes optimal use of the capillary action.

In addition to the use of capillary action, the adaptation of the overlap provides adhesion and fastening of the component to the mounting plate during the transport on the SMT production line.

Preferably, the at least one component contact surface completely covers the at least one mounting plate contact surface corresponding to it. This makes it possible to take especially good advantage of capillary action.

In special embodiments, it can be advantageous if in or after step b) the at least one electronic component is additionally fixed to the mounting plate by means of adhesive points. This allows an especially positionally stable fixation of the electronic component.

In an advantageous further development of these embodiments, the adhesive points consist of a thermosetting adhesive material, the temperature required for the thermosetting lying below the melting point of the solder paste. This ensures the production of a positionally stable connection of the at least one electronic component with the mounting plate already before the solder paste melts, which can reliably prevent displacement, twisting, or floating of the component.

Alternatively, any other adhesive process and adhesive materials can also be used.

In special embodiments, the at least one electronic component has at least two component contact surfaces and the mounting plate has at least two mounting plate contact surfaces corresponding to them. In these embodiments, the pads have a type of air channel (outgassing channel) formed between them that serves to remove the outgassing flux and the displaced atmosphere under the component. These embodiments are especially advantageous in the case of large components. It is expedient for the design or layout, the dimension and the number of pads and the outgassing channels lying between the pads to be dimensioned depending on the maximal measured void size and depending the solder paste to be applied, this lying within the discretion and ability of a person skilled in the art.

The combination of the inventive process with the corresponding layout of the pads and air channels reproducibly produces void-free solder joints. The layout, dimension, and number of pads on the component side are usually specified by the component manufacturers.

The invention is very well suited to connect, by soldering SMD components (surface-mounted devices) and optoelectronic components, in particular LED components (light emitting diodes), with mounting plates such as circuit boards. The invention is also advantageous for connecting, by soldering other optoelectronic components, e.g., lasers.

The invention along with other embodiments and advantages is explained in detail below using non-restrictive sample embodiments, which are illustrated in the attached drawings. The figures are as follows:

FIG. 1 shows a perspective view of a mounting plate after the printing of the solder paste shortly before the mounting plate is equipped with an electronic component;

FIG. 2 *a-c* show the individual steps of the inventive process, i.e., printing of solder paste, equipping the mounting plate with the electronic component, and heating the solder paste, these steps being illustrated on the basis of sectional views through the view from FIG. 1;

FIGS. 3*a* and 3*b* show a solidified soldered connection with adhesive points, which fix the electronic component, top view (FIG. 3*a*) and side view (FIG. 3*b*);

FIG. 6 shows a top view of another sample layout of contact surfaces and printed solder surfaces to connect, by soldering a diode with two emitting surface to a mounting plate; and FIG. 7 shows a top view of another sample layout of contact surfaces and printed solder surfaces to connect, by soldering a diode with two emitting surface to a mounting plate.

FIG. 8 shows (a) a first X-ray of a circuit board and (b) a second X-ray of a circuit board.

Figure 1:
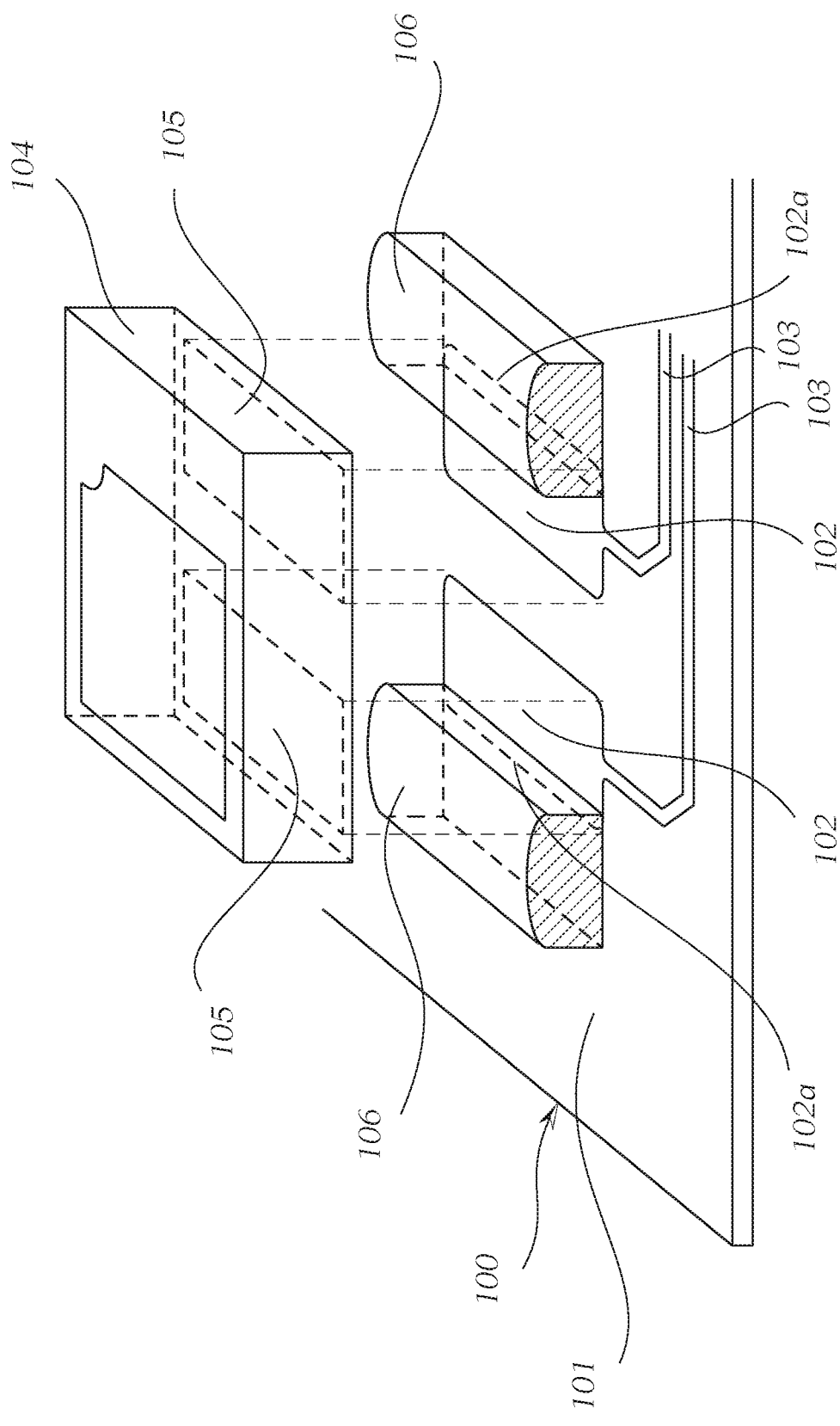

FIG. 1 shows a perspective schematic view of a mounting plate 100 (circuit board 100), which has two mounting plate contact surfaces 102 (pads 2) and two traces 103 leading to the mounting plate contact surfaces 102. The mounting plate contact surfaces 102 are each in the form of a part of a copper surface (see FIG. 2*a-c*), which can preferably be coated with silver, tin, and/or gold, and are surrounded, in a way known in the art, by a solder resist layer 101. The solder resist layer 101 borders the respective mounting plate contact surfaces 102. The traces 103 can also run beneath the solder resist layer 101, in a way known in the art. This mounting plate 100 corresponds to a mounting plate as is known from the prior art. Along a long side 102*a* of the respective mounting [plate] contact surfaces 102, solder paste 106 is printed on the solder resist layer 101. The solder paste 106 is printed that it minimally overlaps with the mounting [plate] contact surface 102 along its long side 102*a*. The depth of this overlap is usually determined by the tolerances of the printing of the solder paste 106, and is about 0.3 mm in the example shown; this corresponds to twice the usual tolerance of the printing process. A process to apply solder paste 106 known from the prior art is the stencil printing process, which allows the application of especially exact shapes of solder paste with constant height.

FIG. 1 also shows an electronic component 104, here an LED, which is supposed to be fastened to the mounting plate 100 through a soldered connection. The component 104 has two component contact surfaces 105 corresponding to the mounting plate contact surfaces 102. The component contact surfaces 105 are indicated by dashed lines. The component contact surfaces 105 are essentially congruent with the mounting [plate] contact surfaces 102.

Figure 2:
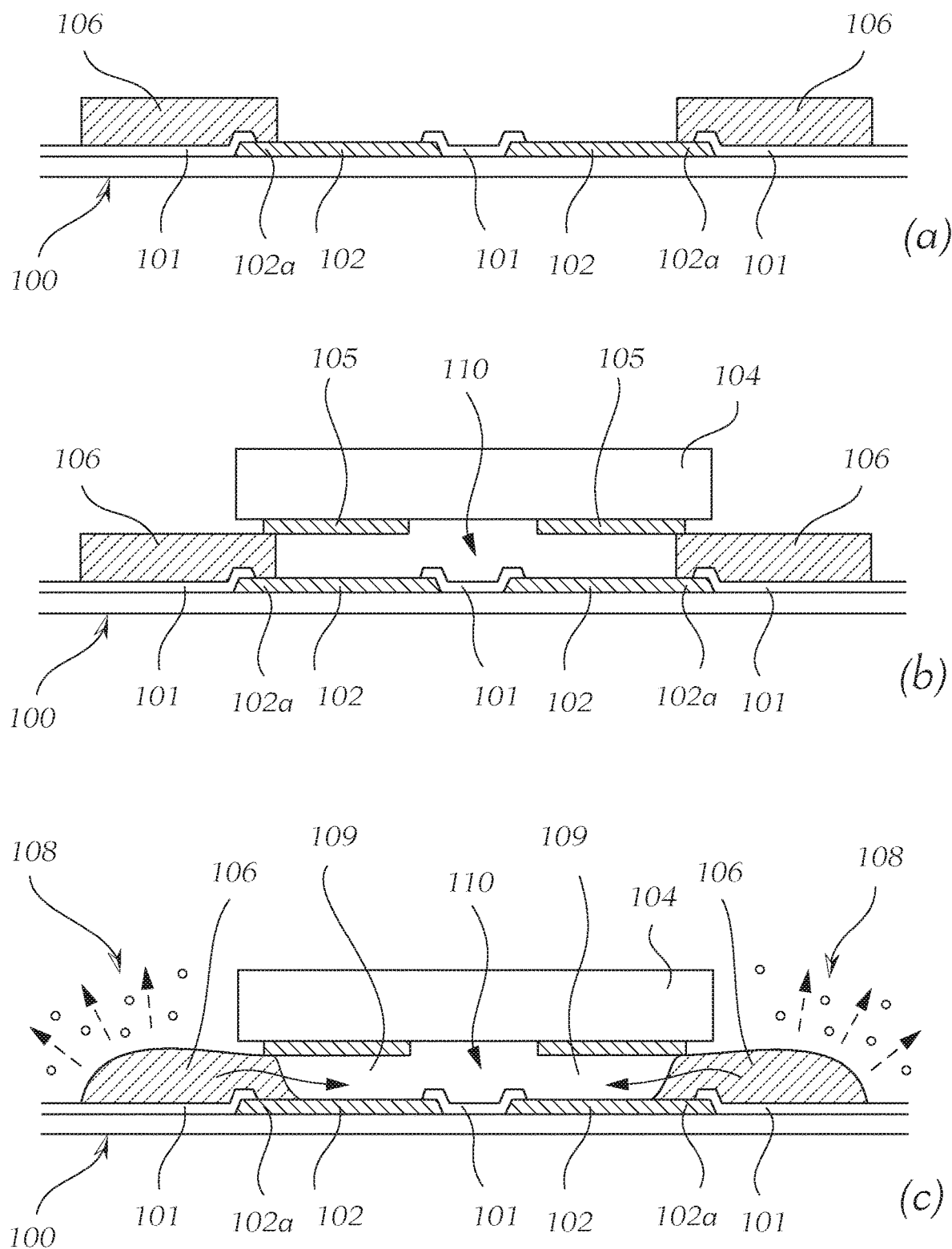

FIG. 2*a-c* show the individual steps of the inventive process on the basis of sectional views through the arrangement shown in FIG. 1. FIG. 2*a* shows the printing of solder paste 106 onto the solder resist layer 101 of the mounting plate 100 along one long side 102*a* of each mounting plate contact surface 102, minimally overlapping with the mounting plate contact surface 102. FIG. 2*b* shows the mounting plate 100 being equipped with the electronic component 104, the component 104 being positioned on the mounting plate 100 so that the respective component contact surface 105 covers the corresponding mounting plate contact surface 102. The component contact surfaces 105 can now be connected with the mounting plate contact surfaces 102 by the solder paste 106 or the solder contained in it. FIG. 2c now shows the actual soldering process, in which the solder paste 106 is heated and the solder contained in the solder paste 106 melts and is pulled by capillary action into the solder joint area 109 between mounting plate contact surface 102 and component contact surface 105. The flux outgassing from the solder paste 106 escapes not directly in the solder joint area 109, but rather already beforehand, as is indicated by reference number 108. Any bubbles that might still move inward into the solder joint area 109 can be removed through the air channel 110, which is formed between the mounting plate contact surfaces 102.

Figure 3:
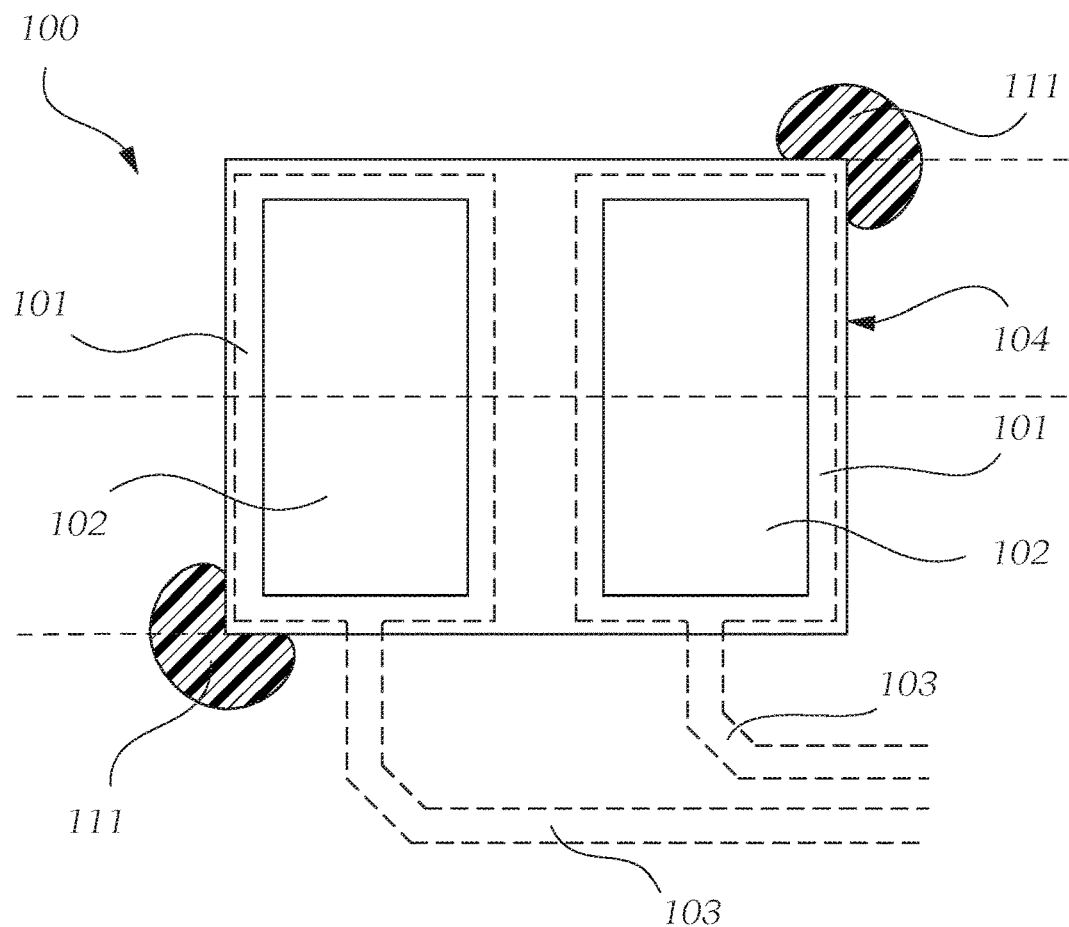
Figure 3:
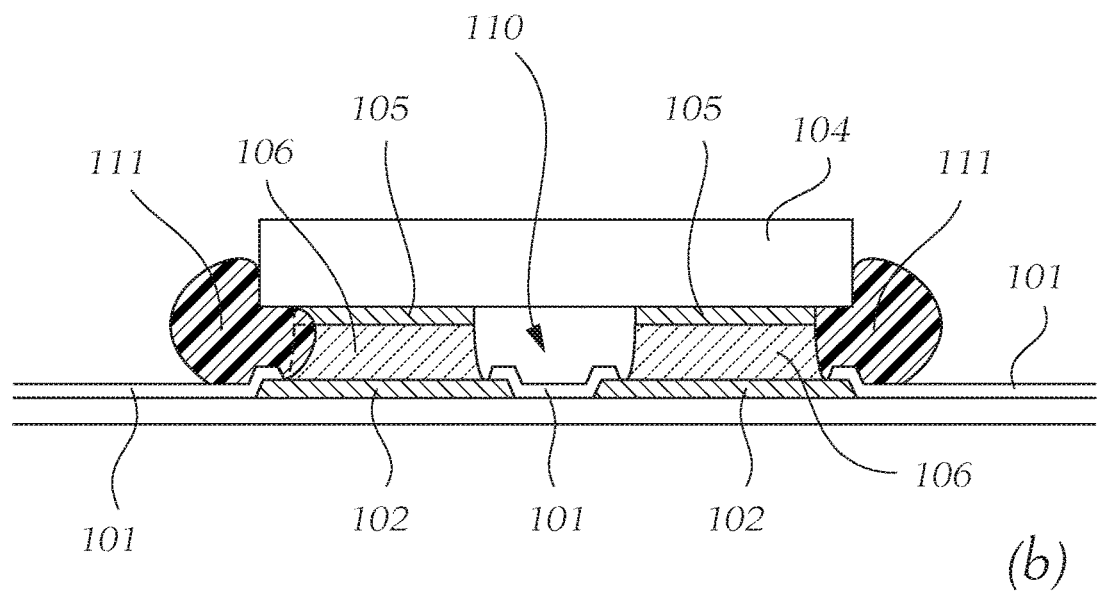

FIG. 3a-b shows a further development of the solidified soldered connection arrangement shown in FIGS. 1 and 2a-c, top view (FIG. 3a) and side view (FIG. 3b). In the soldered connection arrangement shown in FIGS. 3a and 3b, the electronic component 104 is additionally fixed to the mounting plate 100 by means of adhesive points 111. The adhesive points 111 are arranged at two opposite corners of the essentially rectangular component, however other adhesive point arrangements are also possible. Providing adhesive points 111 allows an especially positionally stable fixation of the component 104. The adhesive points 111 consist of a thermosetting adhesive material, the temperature required for the thermosetting of the adhesive points lying below the melting point of the solder paste 106.

For example, the thermosetting adhesive material that is used can be Loctite® 3621 (supplied by Henkel) and the solder paste that is used can be SAC305 (supplied by the Kester company). This ensures the production of a positionally stable connection of the component 104 with the mounting plate 100 already before the solder paste 106 melts, which can reliably prevent displacement, twisting, or floating of the component 104. The surfaces drawn in with dashed lines in FIG. 3a indicate those areas of the mounting plate contact surface 102 or the traces 103, which lie under the solder resist 101. For clarity, the areas of rectangular mounting plate contact surfaces 102 that are not covered by solder resist 101 and that are provided for soldered connection are drawn with solid lines; however, in the view of the soldered connection arrangement shown in FIG. 3a they are covered by the component 104 and therefore are not visible.

Figure 4:
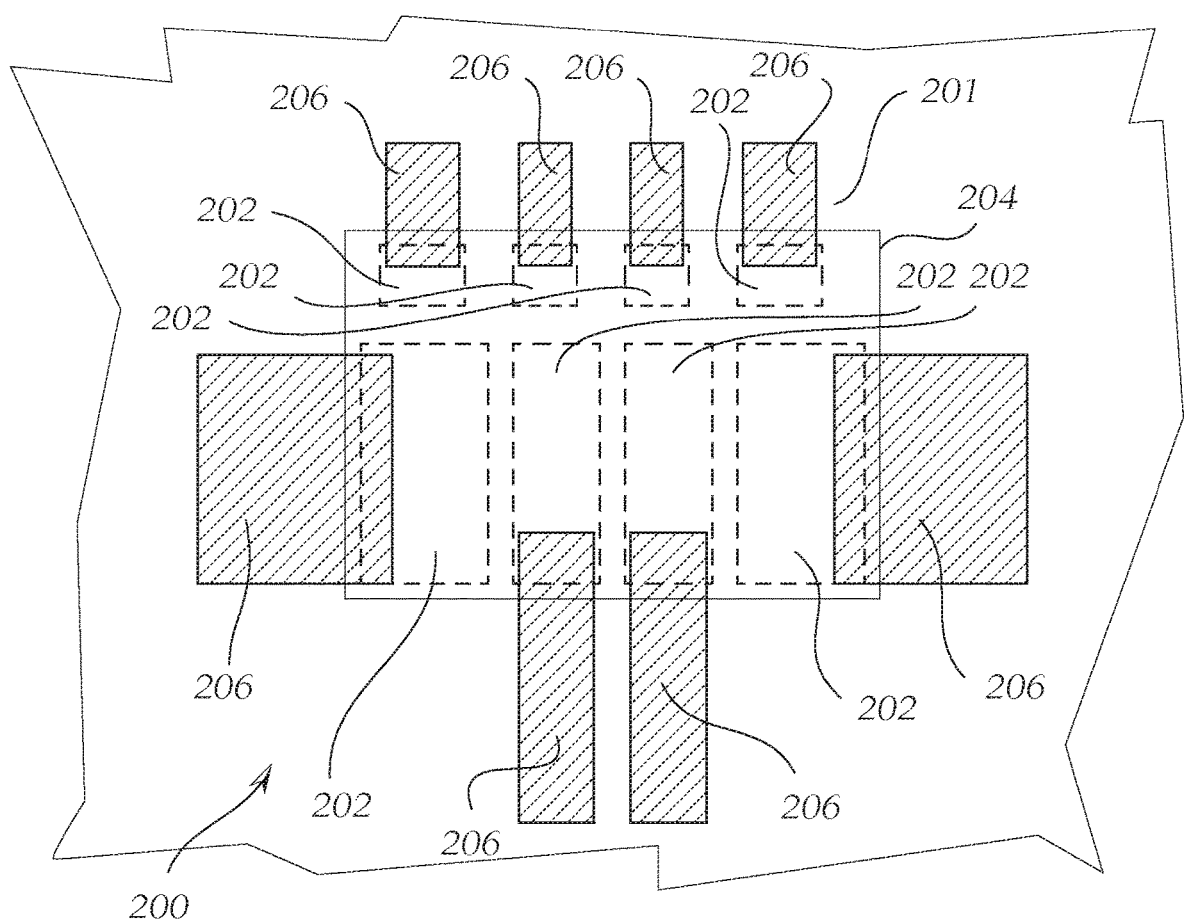
FIG. 4 shows a top view of a sample layout of contact surfaces and printed solder surfaces to connect, by soldering a diode with four emitting surface to a mounting plate.

FIG. 4 shows a top view of a sample layout of mounting plate contact surfaces 202 (the mounting plate contact surfaces 202 are shown in clashed lines, since in top view they are covered by the component 204 that is put on them) and solder paste surfaces 206 printed on them to connect, by soldering an electronic component 204, here a diode with four emitting surfaces, to a mounting plate 200. Each of the corresponding contact surfaces of the mounting plate 200 and the component 204 are congruent. The areas where the printed solder paste surfaces 206 overlap with the contact surfaces 202 of the mounting plate 200 or with the congruent corresponding contact surfaces of the component 204 can clearly be seen. It can also clearly be seen in FIG. 4 that the solder paste 206 is applied to the adjacent solder resist layer 201 according to the layout, either along a long side or a transverse side of the respective contact surface, minimally overlapping with the contact surface. During the soldering process, the areas between the individual contact surfaces serve as additional outgassing channels for the outgassing flux, as was already described in detail above for FIG. 2a-c.

Figure 5:
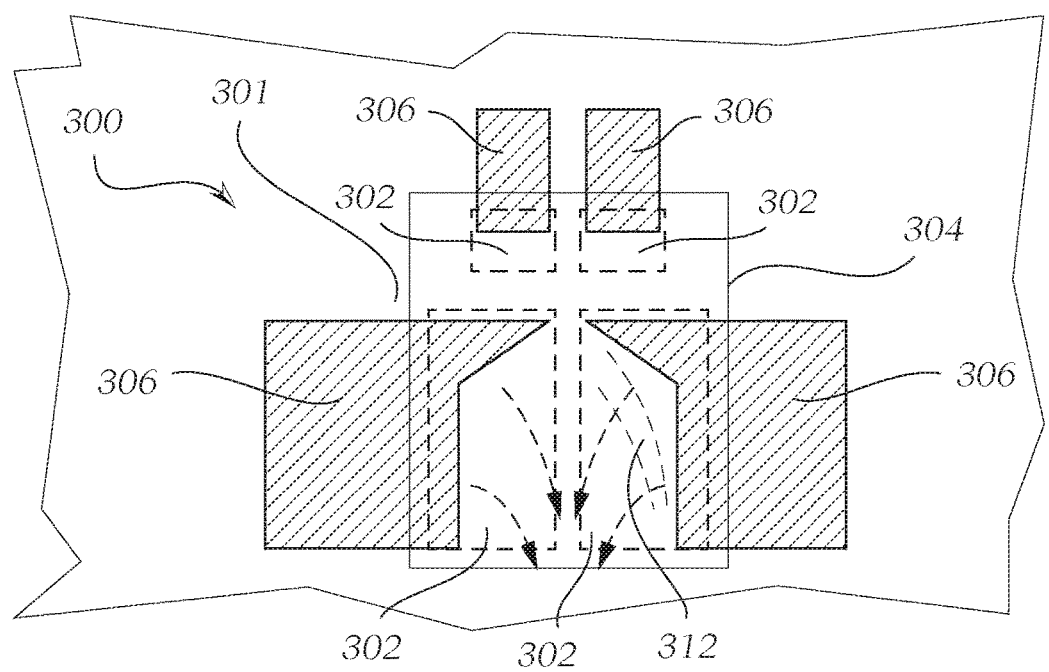
FIG. 5 shows a top view of another sample layout of contact surfaces and printed solder surfaces to connect, by soldering a diode with two emitting surface to a mounting plate.

FIG. 5 shows a top view of another sample layout of mounting plate contact surfaces 302 (the mounting plate contact surfaces 302 are shown in dashed lines, since in top view they are covered by the component 304 that is put on them) and solder paste surfaces 306 printed on them to connect, by soldering an electronic component 304, here a diode with two emitting surfaces, to a mounting plate 300. Each of the corresponding contact surfaces of the mounting plate 300 and the component 304 are congruent. The two larger contact surfaces 302 have a large pad surface and a small distance to one another. As can clearly be seen in FIG. 5, the solder paste 306 is printed onto the solder resist layer 301 adjacent to the larger contact surfaces 302 of the mounting plate 300 so that each of the overlap areas lies on a long side of the contact surfaces 302, the depth of the overlap increasing starting from a minimum overlap. The largest overlap is reached at one end of the long side in each case, so that during the soldering process the atmosphere under the component can be displaced in one direction. This makes it possible to influence the direction of spread of the solder front 312 and defines a certain direction for the atmosphere to escape, without being bound to a certain theory. Varying the depth of solder paste overlap areas on a side edge of the contact surfaces, here the long side, is especially advantageous in the case of large mounting plate contact surfaces and in the case of contact surfaces that have only a small distance to one another.

FIG. 6 shows a top view of another sample layout of mounting plate contact surfaces 402 (the mounting plate contact surfaces 402 are shown in clashed lines, since in top view they are covered by the component 404 that is put on them) and solder paste surfaces 406 printed on them to connect by, soldering an electronic component 404 (only partly shown), here a diode with two emitting surfaces, to a mounting plate 400. Each of the respective contact surfaces 402 of the mounting plate 400 and the corresponding contact surfaces of the component 404 are congruent. The contact surface 402 is essentially square with four side edges and is bordered by a solder resist layer 401. As can clearly be seen in FIG. 6, the solder paste 406 is printed onto the solder resist layer 401 so that the depth of the overlap with a side edge 402a of the contact surface 402 increases starting from a minimum overlap, which is about 0.3 mm, toward the middle of the side edge 402a. This variant also makes it possible to influence the direction of spread of the solder front (shown by arrows) and defines a certain direction for the atmosphere to escape, without being bound to a certain theory. This variant is also especially advantageous in the case of large mounting plate contact surfaces and in the case of contact surfaces that have only a small distance to one another.

FIG. 7 shows a top view of another sample layout of mounting plate contact surfaces 502 (the mounting plate contact surface 502 is shown in dashed lines, since in top view it is covered by the component 504 that is put on it) and solder paste surface 506 printed on it to connect, by soldering an electronic component 504, here a diode with two emitting surfaces, to a mounting plate 500. The contact 502 of the mounting plate 500 and the corresponding contact surface of the component 504 are congruent. The contact surface 502 is essentially square with four side edges and is bordered by a solder resist layer 401. As can clearly be seen in FIG. 7, the solder paste 506 is printed onto the solder resist layer 501 so that each of the overlap areas of the solder paste 506 with a side edge 502 lies at a first side edge 502a and a second side edge 502b, which is adjacent to the first side edge 502a, so that during the soldering process the atmosphere under the component can be displaced in one direction. In the case of rectangular contact surfaces, the solder paste 506 is applied, at least in areas along a long side and along a transverse side (wide side, narrow side) of the contact surface 502. This variant also makes it possible to influence the direction of spread of the solder front (also shown by lines and arrows) and defines a certain direction for the atmosphere to escape, without being bound to a certain theory. This variant is also especially advantageous in the case of large mounting plate contact surfaces and in the case of contact surfaces that have only a small distance to one another.

Example 1: Comparison of the Formation of Voids During the Connection by Soldering of Electronic Components on Circuit Boards with the Inventive Soldering Process and with a Standard Soldering Process In this example, the formation of voids has been compared when electronic components are connected, by soldering to circuit boards using the inventive soldering process and using a standard soldering process.

The comparison experiments were done using IMS circuit boards of the manufacturer EUROSIR (aluminum IMS, Insulated Metal Substrate, with an aluminum thickness of 1.5 mm). The solder paste used was an SAC305 solder paste (manufacturer/supplier the Kester company), and the reflow soldering process was done using a soldering furnace of the Rehm company.

The experiments using the inventive soldering process and the standard process were done using circuit boards equipped with an LED component of the type Oslon Black Flat 1×4 (manufacturer: Osram) and six LED components of the type Oslon Compact. Here 24 circuit boards formed a panel, and were simultaneously processed in the reflow process. The temperature ramps of the heating and cooling process, and the hold times follow the JEDEC standard. The total duration of the reflow processes was 300 seconds, and the maximum temperature of 260° C. was held for 5 seconds.

Following the respective soldering process according to the inventive process or the standard process, the soldered connections were analyzed for voids in an X-ray apparatus (Matrix Technologies). If the proportion of voids exceeded 30% of the contact surface of an individual pad, a soldered circuit board/component arrangement was considered to be a failure.

Standard Soldering Process:

In the standard soldering process, the solder paste was printed directly and exclusively onto the pads of the circuit board. Thus, after printing and mounting, all the solder provided is located directly under the LED components. Following the reflow soldering, it was found that 20% of the processed circuit boards did not meet the above-mentioned criteria due to void formation, and therefore were evaluated as rejects. FIG. 8 (*a*) shows an X-ray of a circuit board with soldered LED components (labeled with the reference numbers 604). Metal surfaces appear in three shades of gray of decreasing brightness: Cu traces and spreading surfaces, solder-covered contact surfaces, and emitting surfaces lying over them. The voids in the form of bubbles (larger voids are indicated with the reference numbers 620) appear in the gray tone of the Cu surfaces lying beneath them. In FIG. 8 (*a*), the 30% proportion of voids is exceeded in the third contact surface from the left.

Inventive Soldering Process:

In the inventive soldering process, the solder paste (solder paste 206) was printed onto the solder resist layer (solder resist layer 201) of the circuit board (mounting plate 200) according to the layout shown in FIG. 4, minimally overlapping with the long sides and transverse sides of the pads/contact surfaces (mounting plate contact surfaces 202) of the circuit board. If the solder is provided according to the inventive process essentially outside the contact surfaces, i.e., only minimally overlapping with the contact surfaces of the component and the circuit board, only a single failure was found out of about 1,500 examined circuit boards. FIG. 8 (*b*) shows that the solder joints are essentially free of voids and that only minimal voids are present in the areas of the contact surface edge through which the solder was pulled under the component.

The invention can be modified in any way by the person skilled in the art, and it is not limited to the embodiments shown. It is also possible to take individual aspects of the invention and combine them with one another to a large extent. What is essential are the ideas on which the invention is based, which can be executed in diverse ways by the person skilled in the art on the basis of this teaching, but nevertheless remain the same.

The invention claimed is:

1. A process to connect, by soldering, at least one electronic component (304) to a quadrilateral mounting plate (300), the mounting plate having at least one mounting plate contact surface (302), and the at least one electronic component having at least one component contact surface corresponding to the at least one mounting plate contact surface, the at least one mounting plate contact surface being surrounded by a solder resist layer (301) that borders the at least one mounting plate contact surface, the process comprising:

applying solder paste (306) onto an area of the solder resist layer (301) that is bordering a long side or a transverse side of the at least one mounting plate contact surface (302) so that the solder paste overlaps onto the bordering long side or transverse side, creating an overlap having a minimum and maximum overlap;

mounting the at least one electronic component (304) onto the mounting plate, the at least one component contact surface at least partly covering the corresponding at least one mounting plate contact surface (302); and heating the solder paste (306) to produce a soldered connection between the mounting plate and the at least one electronic component, wherein, if the solder paste overlaps the long side of the at least one mounting plate contact surface, (i) a long-side depth of the minimum overlap of the solder paste with the at least one mounting plate contact surface along the long side lies in a range of about 0.2-0.5 mm at a first terminal end of the long side and (ii) starting from the minimum overlap, the long-side depth of the overlap of the solder paste with the at least one mounting plate contact surface increases in length from the minimum overlap to reach the maximum overlap at a second terminal end of the long side; and wherein, if the solder paste overlaps the transverse side of the at least one mounting plate contact surface, (i) a transverse-side depth of the minimum overlap of the solder paste with the at least one mounting plate contact surface along the transverse side lies in a range of about 0.3-0.7 mm at a first terminal end of the transverse side and (ii) starting from the minimum overlap, the transverse-side depth of the overlap of the solder paste with the at least one mounting plate contact surface increases in length from the minimum overlap to reach the maximum overlap at a second terminal end of the transverse side.

2. The process according to claim 1, wherein the solder paste (306) is applied to the solder resist layer (301) along the long side of the at least one mounting plate contact surface and overlaps with the at least one mounting plate contact surface (302).

3. The process according to claim 1, wherein the solder paste (306) is applied to the solder resist layer (301) along the transverse side of the at least one mounting plate contact surface and overlaps with the mounting plate contact surface (302).

4. The process according to claim 1, wherein the depth of the minimum overlap of the solder paste with the at least one mounting plate contact surface along the long side of the at least one mounting plate contact surface is about 0.3 mm.

5. The process according to claim 1, wherein the depth of the minimum overlap of the solder paste with the at least one mounting plate contact surface along the transverse side of the at least one mounting plate contact surface is about 0.5 mm.

6. The process according to claim 1, wherein during or after the mounting step, the at least one electronic component is additionally fixed to the mounting plate by adhesive points.

7. The process according to claim 6, wherein the adhesive points consist of a thermosetting adhesive material, and wherein the temperature required for thermosetting the thermosetting adhesive material is less than the melting point of the solder paste.

8. The process according to claim 1, wherein the at least one component contact surface comprises at least two component contact surfaces, and the at least one mounting plate contact surface comprises at least two mounting plate contact surfaces (302) corresponding to the at least two component contact surfaces.

9. The process according to claim 1, wherein the at least one electronic component is an optoelectronic component.

10. The process according to claim 9, wherein the at least one optoelectronic component is an LED.

11. The process according to claim 1, wherein the at least one electronic component is an SMD component.

12. The process according to claim 1, wherein the maximum overlap extends all the way from an edge of the at least one mounting plate contact surface overlapped by the solder paste to an opposite side edge of the at least one mounting plate contact surface opposite from the edge of the at least one mounting plate contact surface overlapped by the solder paste.

13. The process according to claim 1, wherein the solder paste (306) is applied to the solder resist layer (301) along the long side of the at least one mounting plate contact surface and overlaps with the at least one mounting plate contact surface (302); and wherein the maximum overlap extends from the long side of the at least one mounting plate contact surface overlapped by the solder paste all the way to an opposite long side of the at least one mounting plate contact surface opposite from the long side of the at least one mounting plate contact surface overlapped by the solder paste.

14. A process to connect, by soldering, at least one electronic component to a square mounting plate, the mounting plate having at least one mounting plate contact surface, and the at least one electronic component having at least one component contact surface corresponding to the at least one mounting plate contact surface, the at least one mounting plate contact surface being surrounded by a solder resist layer that borders the at least one mounting plate contact surface, the process comprising:
    applying solder paste onto an area of the solder resist layer that is bordering a side of the at least one mounting plate contact surface, so that the solder paste overlaps onto the bordering side, creating an overlap having a minimum and maximum overlap;
    mounting the at least one electronic component onto the mounting plate, the at least one component contact surface at least partly covering the corresponding at least one mounting plate contact surface; and
    heating the solder paste to produce a soldered connection between the mounting plate and the at least one electronic component;
    wherein a depth of the minimum overlap of the solder paste with the at least one mounting plate contact surface along the side of the at least one mounting plate contact surface lies in a range of about 0.2-0.5 mm at a first terminal end of the side; and
    wherein, starting from the minimum overlap, the depth of the overlap of the solder paste with the at least one mounting plate contact surface increases in length from the minimum overlap to reach the maximum overlap at a second terminal end of the side.

15. The process according to claim 14, wherein the depth of the minimum overlap of the solder paste with the at least one mounting plate contact surface along the side of the at least one mounting plate contact surface is about 0.3 mm.

16. The process according to claim 14, wherein the at least one component contact surface completely covers the at least one mounting plate contact surface (302) corresponding to the at least one component contact surface.

17. The process according to claim 14, wherein the at least one electronic component is an optoelectronic component.

18. The process according to claim 17, wherein the at least one optoelectronic component is an LED.

19. The process according to claim 14, wherein the at least one electronic component is an SMD component.

20. The process according to claim 14, wherein the maximum overlap extends all the way from an edge of the at least one mounting plate contact surface overlapped by the solder paste to an opposite side edge of the at least one mounting plate contact surface opposite from the edge of the at least one mounting plate contact surface overlapped by the solder paste.

* * * * *